United States Patent [19]

Faraone

[11] Patent Number: 4,757,360
[45] Date of Patent: Jul. 12, 1988

[54] FLOATING GATE MEMORY DEVICE WITH FACING ASPERITIES ON FLOATING AND CONTROL GATES

[75] Inventor: Lorenzo Faraone, Belle Mead, N.J.
[73] Assignee: RCA Corporation, Princeton, N.J.
[21] Appl. No.: 511,250
[22] Filed: Jul. 6, 1983
[51] Int. Cl.⁴ ............... H01L 29/78; G11C 11/40
[52] U.S. Cl. ............................. 357/23.5; 357/59
[58] Field of Search ............... 357/23.14, 23.1, 23.5, 357/54

[56] References Cited

U.S. PATENT DOCUMENTS

| | | | |
|---|---|---|---|
| 4,099,196 | 4/1978 | Simko | 357/23 |
| 4,119,995 | 10/1978 | Simko | 357/23 |
| 4,274,012 | 6/1981 | Simko | 307/238.3 |
| 4,314,265 | 2/1982 | Simko | 357/54 |

OTHER PUBLICATIONS

Han-Sheng Lee, A New Approach for Floating Gate MOS Nonvolatile Memory, Oct. 1, 1977, Appl. Physics Ltrs. vol. 31, No. 7, pp. 475-476.

*Primary Examiner*—William D. Larkins
*Attorney, Agent, or Firm*—Henry I. Steckler; Paul R. Webb, II; James C. Davis, Jr.

[57] ABSTRACT

A floating gate memory device includes a substrate of semiconductor material having on a surface thereof a layer of insulating material. On the insulating layer is a floating gate of conductive polycrystalline silicon with the floating gate having a textured outer surface and relatively smoother sidewalls. A second layer of insulating material extends over the outer surface and sidewalls of the floating gate. The portion of the second insulating material over the outer surface of the floating gate has a textured surface and is thinner than the portions of the second insulating layer over the sidewalls of the floating gate. A control gate is over the second insulating layer and extends over the outer surface and sidewalls of the floating gate. The control gate is of conductive polycrystalline silicon and has an inner surface portion over the textured outer surface of the control gate which is textured and has undulations which substantially follow the undulations of the textured surface of the floating gate.

5 Claims, 1 Drawing Sheet

FLOATING GATE MEMORY DEVICE WITH FACING ASPERITIES ON FLOATING AND CONTROL GATES

BACKGROUND OF THE INVENTION

The present invention relates to a floating gate memory device and method of making the same. More particularly, the present invention relates to a floating gate memory device having a lower capacitance and more uniform tunneling characteristics between the floating gate and a control gate, and a method of making the device.

One type of semiconductor memory device is a metal-oxide-semiconductor (MOS) device having a floating gate, in which the charge is stored, insulated from a semiconductor substrate, generally by a layer of silicon oxide, and a second or control gate over the floating gate and insulated therefrom, generally by a layer of silicon oxide. The control gate generally extends across the sidewalls of the floating gate as well as over the outer surface of the floating gate. One type of such a floating gate memory device uses the Fowler-Nordheim tunneling effect to cause a flow of electrons onto the floating gate from the control gate through the intermediate silicon oxide layer to charge the floating gate and to cause the flow of electrons from the floating gate to the control gate to discharge the floating gate. Charging or discharging the floating gate is achieved by applying a relatively high voltage of the appropriate polarity between the control gate and the substrate and tailoring the capacitance between the floating gate and each of the substrate and the control gate so that a larger portion of the voltage drop is between the control gate and the floating gate than between the substrate and the floating gate. Thus, it is desirable to have a low capacitance between the floating gate and the control gate so that the capacitive coupling between the two gates will induce higher voltages therebetween.

There are a number of factors which effect the capacitance between the two gates. One factor is the thickness of the insulating layer between the gates. Although thicker insulating layers provide lower capacitance, thicker layers require a corresponding increase in the voltages for charging or discharging the floating gate. Therefore, it would be desirable to be able to provide a relatively thick insulating layer which has enhanced conduction at lower fields to satisfy both the voltage limitations and the capacitance requirements. Another factor to be considered is that the control gate extends across the sidewalls of the floating gate as well as over the outer surface of the floating gate so that the capacitance between the sidewalls of the floating gate and the control gate contribute to the overall capacitance between the two gates. With the present trend to making the gates narrower to achieve higher circuit density, the thickness of the floating gate approaches its width dimension so that the sidewall capacitance becomes a major portion of the overall capacitance. In addition, variations in the thickness of the floating gate which may result from manufacturing process variations would then result in major changes in the capacitance between the two gates.

Another problem with regard to the operation of the floating gate memory device, particularly when using polycrystalline silicon for the gates, arises from the fact that the conduction properties of silicon oxide grown over polycrystalline silicon are asymmetrical. By asymmetrical it is meant that the oxide is far more conductive when the control gate is positive, i.e. the flow of electrons is from the floating gate to the control gate, then when the floating gate is positive, i.e. the flow of electrons is from the control gate to the floating gate. Thus, the voltage required to cause electron conduction from the control gate to the floating gate is generally much higher than the voltage required to cause electron conduction from the floating gate to the control gate. For the successful operation of floating gate memory devices that operate on the principle of charge transfer as described above, it would be desirable to have both voltages equal or at least as close as possible.

This difference in operating voltages results from the fact that the silicon oxide grown on a polycrystalline silicon layer causes the surface of the polycrystalline silicon layer to be textured, whereas the outer surface of the oxide layer, on which the outer polycrystalline silicon layer is deposited, is relatively smoother. The textured surface has hillochs which act as pointed emitters to create high fields when the inner polycrystalline silicon layer is negative with respect to the outer polycrystalline silicon layer so that it provides high electron conduction from the inner layer to the outer layer. However, the inner surface of the outer polycrystalline silicon layer is smoother so that for the same applied field, the conduction from the outer layer to the inner layer is substantially lower.

In my copending patent application, Ser. No. 505,728, filed June 20, 1983, now abandoned, there is described a structure and method of making it which alleviates this problem by making the inner surface of the outer polycrystalline silicon layer textured, with undulations which substantially follow the undulations of the textured surface of the inner polycrystalline silicon layer. Thus, both polycrystalline silicon layer have hillochs which act as emitters to increase the conduction in both directions between the two layers.

SUMMARY OF THE INVENTION

A floating gate memory device includes a substrate of a semiconductor material having a layer of an insulating material on a surface thereof. A conductive floating gate is on the insulating layer and has an outer surface and sidewalls. A second layer of an insulating material covers the outer surface and sidewalls of the floating gate. A conductive control gate is on the second insulating layer and has an inner surface portion opposed to the outer surface of the floating gate and inner surface portions opposed to the sidewalls of the floating gate. The outer surface of the floating gate and the opposed portion of the inner surface of the control gate are textured. The portion of the second insulating layer between the outer surface of the floating gate and its opposed portion of the inner surface of the control gate is thinner than the portions of the second insulating layer which are between the sidewalls of the floating gate and the opposed portions of the inner surface of the control gate.

DETAILED DESCRIPTION OF PREFERRED EMBODIMENT

Figure 1:
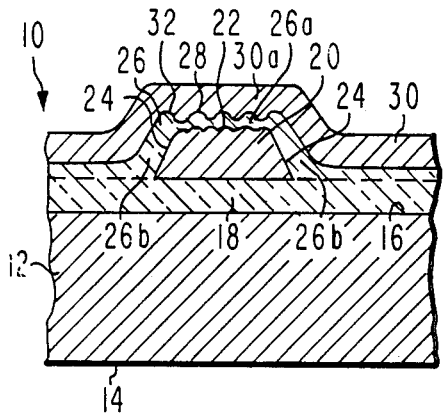
FIG. 1 is a sectional view of a portion of a floating gate memory device which incorporates the present invention.

Referring to FIG. 1, a portion of a floating gate memory device is designated as 10. The floating gate memory device 10 includes a substrate 12 of a semiconductor material, such as single crystal silicon, having opposed major surfaces 14 and 16. Although not shown, there is within the substrate 12 at the surface 16 source and drain regions spaced apart by a channel region. The source, drain and channel regions may be of any desired configuration for the particular memory device being formed. For example they may be of the configuration shown and described in the patent application of Roger G. Stewart et al., Serial No. 467,643, filed Feb. 18, 1983, entitled "DUAL WORD LINE, ELECTRICALLY ALTERABLE, NONVOLATILE FLOATING GATE MEMORY DEVICE", assigned to the assignee of the present application. However, the particular configuration of the source, drain and channel regions form no part of the present invention.

On the surface 16 of the substrate 12 is a layer 18 of an insulating material, such as silicon oxide. On the insulating layer 18 is a floating gate 20 which extends over at least a portion of the channel region in the substrate 12. The floating gate 20 is of polycrystalline silicon which may be doped to be conductive. The floating gate 20 has an outer surface 22 which is textured, and sidewalls 24 which are relatively smoother. The textured outer surface 22 has undulations which form hillochs projecting from the outer surface 22. Over the floating gate 20 is a second layer 26 of an insulating material, such as silicon oxide, which extends over the outer surface 22 of the floating gate 20 and the sidewalls 24 of the floating gate 20. The portion 26a of the second insulating layer 26 which is over the textured outer surface 22 of the floating gate 20 has a textured outer surface 28. The textured outer surface 28 has undulations which substantially follow the undulations of the textured outer surface 22 of the floating gate 20. The portion 26a of the second insulating layer 26 which is over the outer surface 22 of the floating gate 20 is thinner than each of the portions 26b of the second insulating layer 26 which is along a sidewall 24 of the floating gate 20.

A control gate 30 is on the second insulating layer 26 and extends over the outer surface 22 of the floating gate 20 and over the sidewalls 24 of the floating gate 20. The portion 30a of the control gate 30 which is over the textured outer surface 22 of the floating gate 20 has an inner surface 32 which is textured with the undulations thereof conforming to the undulations of the textured surface 28 of the second insulating layer 26.

Figure 2:
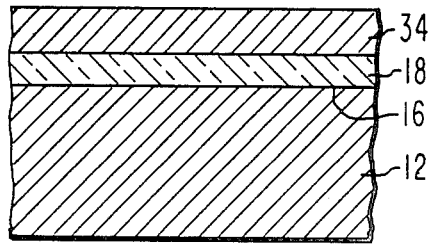
FIGS. 2–6 are sectional views illustrating the various steps of the method of the present invention for making the floating gate memory device shown in FIG. 1.

Referring to FIG. 2, the floating gate memory device 10 can be made using a substrate 12, having the source and drain regions of the memory device formed therein by methods well known in the art. Alternatively, as is well known in the art, the source and drain regions may be formed in the substrate 12 after the various gates are formed to achieve self alignment between the gates and the source and drain regions.

The first insulating layer 18 can be formed on the substrate 12 by subjecting the substrate surface 16 to an atmosphere of oxygen and/or water vapor at a temperature of about 800° C. to oxidize the surface of the substrate 12.

A layer 34 of polycrystalline silicon is then formed on the insulating layer 18. This is preferably achieved by depositing a layer of amorphous silicon on the insulating layer 18 and annealing the amorphous layer to convert it to polycrystalline silicon. The amorphous silicon layer can be formed by placing the substrate in a chamber and passing silane through the chamber at a pressure of approximately 500 millitorr and heating the substrate to a temperature of about 560° C. The amorphous silicon layer is then doped with phosphorous by passing $POCl_3$ through the chamber at 950° C. for about 15 minutes. The $POCl_3$ decomposes to form phosphorous which diffuses into the amorphous silicon layer. At the same time, the amorphous silicon layer is converted to polycrystalline silicon. Forming the polycrystalline silicon layer 34 from amorphous silicon is preferred since the deposited amorphous silicon layer has a smooth surface which it retains when converted to polycrystalline silicon whereas the surface of a directly deposited polycrystalline silicon layer will be rough.

Figure 3:
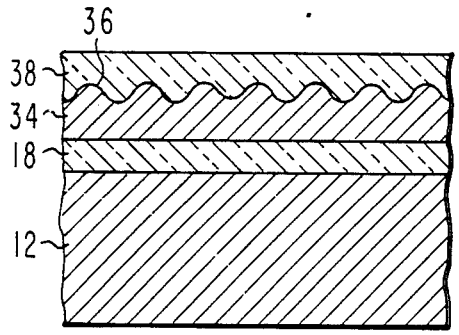
Figure 4:
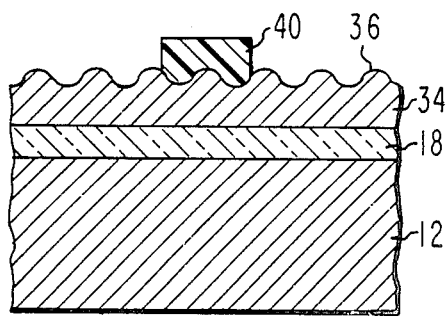

The polycrystalline silicon layer 34 is then heated at 800° C. in an atmosphere of oxygen and steam to oxidize the surface of the polycrystalline silicon layer 34. As the polycrystalline silicon layer 34 is oxidized, the surface 36 at the interface with the oxide layer 38 becomes textured as shown in FIG. 3. The longer the oxidation is carried out, the larger will be the undulations of the textured surface. After the oxidation is carried out for a period to achieve the desired depth of the undulations, the oxide layer 38 is removed such as by etching with buffered hydrofluoric acid, as shown in FIG. 4. This exposes the textured surface 36 of the polycrystalline silicon layer 34.

Figure 5:
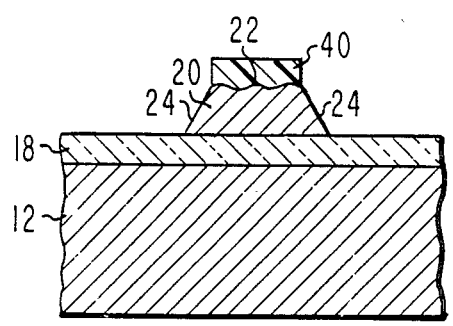
Figure 6:
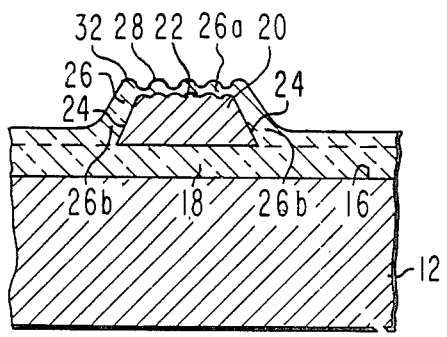

The textured surface 36 of the polycrystalline silicon layer 34 is then coated with a layer of a resist material which is defined, using standard photolithographic techniques, to form a portion 40 which extends over the area of the polycrystalline silicon layer 34 which will be the floating gate 20. The exposed portions of the polycrystalline silicon layer 34 are then removed with a suitable etchant to form the floating gate 20 as shown in FIG. 5. After removing the resist 40, the textured outer surface 22 and sidewalls 24 of the floating gate 20 are then oxidized by exposing them to a mixture of oxygen and steam at 800° C. As shown in FIG. 6, this forms the second insulating layer 26 over the textured outer surface 22 and sidewalls 24 of the floating gate 20. As the silicon oxide layer 26 is grown on the polycrystalline silicon floating gate 20, the surface 28 of the portion 26a over the textured outer surface 22 of the floating gate 20 will also be textured with undulations which substantially follow the undulations of the textured surface 22. Also, as will be shown, the portion 26a of the oxide layer 26 over the textured surface 22 of the floating gate 20 grows slower than the portions 26b over the smoother sidewalls 24 of the floating gate 20. Thus, the portions 26b will be thicker than the portion 26a.

A second polycrystalline silicon layer is then deposited on the second insulating layer 26. The second polycrystalline silicon layer can be deposited directly as polycrystalline silicon or, as previously described with regard to the first polycrystalline silicon layer 34, can be deposited as amorphous silicon and converted to polycrystalline silicon when doped with phosphorous. The portion of the second polycrystalline silicon layer which is deposited on the textured surface 28 of the second insulating layer 26 will have a textured inner surface with undulations that follow the undulations of the textured surface 28. The second polycrystalline silicon layer can then be defined to form the control gate 30. The memory device 10 can then be completed by providing the desired contacts to the control gate and the source and drain regions in the substrate 12 in a manner well known in the art.

The following example is given to show the effects of using the textured surfaces.

EXAMPLE

A pair of substrates of single crystalline silicon were coated with a layer of silicon oxide by subjecting the substrates to oxygen and steam at 800° C. A 5,000 Angstrom thick layer of amorphous silicon was then deposited on the oxide layer by placing the substrates in a chamber and passing silane over the oxide layers at a pressure of approximately 500 millitorr while heating the substrates to 560° C. The amorphous silicon layers were then exposed to $POCl_3$ at 950° C. for 15 minutes to dope the amorphous silicon layers with phosphorous and convert them to polycrystalline silicon.

One of the substrates was maintained as a control substrate. The other substrate was then placed in a chamber and exposed to a mixture of oxygen and 10% steam at 800° C. to form an oxide layer on the polycrystalline silicon layer. The substrate was oxidized for 100 minutes. The oxide layer grown on the polycrystalline silicon layer was then removed by etching with buffered hydrofluoric acid.

The control substrate and the substrate on which the polycrystalline silicon layer was oxidized were then placed in a common chamber and subjected to a mixture of oxygen and 10% steam at 800° C. for 30 minutes. Both of the substrates were then coated with a layer of amorphous silicon in the manner described above. The amorphous silicon layer was then doped with phosphorous and converted to polycrystalline silicon in the manner previously described.

The thickness of the oxide layer between the two polycrystalline silicon layers on each substrate was measured and each device was tested to determine effective barrier height of the oxide layer both with the outer polycrystalline silicon layer being alternatively positive and negative with respect to the inner polycrystalline silicon layer. The effective barrier height is a measure of the tunneling current for a given applied field; the lower the effective barrier height, the higher the tunneling current. The following table shows the oxide thickness and the effective barrier height for the control device and the device in which the lower polycrystalline silicon layer was preoxidized.

TABLE

|  | Oxide Thickness (Angstroms) | Effective Barrier Height (ev) + | Effective Barrier Height (ev) − |
| --- | --- | --- | --- |
| Control (No Preoxidation) | 240 | 2.04 | 2.74 |
| Preoxidized for 100 min. | 180 | 1.78 | 1.82 |

From the above table, it can be seen that a thicker oxide layer grew on the polycrystalline silicon layer of the control substrate, in which the polycrystalline silicon layer had a relatively smooth surface since it was not preoxidized, than on the polycrystalline silicon layer of the other substrate, in which the polycrystalline layer was textured since it was preoxidized.

Thus, in the floating gate memory device 10, the portion 26a of the oxide layer 26 grown over the textured outer surface 22 of the floating gate 20 is thinner than the portion 26b of the oxide layer grown over the smoother sidewalls 24 of the floating gate 20. Since the portions 26b of the oxide layer 26 are thicker, the capacitance between each sidewall 24 of the floating gate 20 and its opposed portion of the control gate 30 is lower. Thus, the overall capacitance between the control gates 30 and the floating gate 20 is lower and is mainly the capacitance between the outer surface 22 of the floating gate 20 and its opposed portion 30a of the control gate 30.

Increasing the thickness of the oxide layer between the sidewalls 24 of the floating gate 20 and the opposed portions of the control gate 30 not only reduces the overall capacitance between the two gates, which is very desirable in a floating gate device, but also minimizes the adverse effect of variations in the thickness of the floating gate 20 which may result from manufacturing process variations. Since the capacitance between the sidewalls 24 of the floating gate 20 and their opposed portions of the control gate 30 now form only a small portion of the overall capacitance between the two gates, variations in the thickness of the floating gate 20 which will vary the area of the sidewalls 24 and thus vary the capacitance between the sidewalls 24 and the control gate 30, have little effect on the overall capacitance between the two gates.

Another result which can be seen from the above Table is that the substrate having the polycrystalline silicon layer which was preoxidized so as to have a textured surface has a lower effective barrier height than the control substrate which has a polycrystalline silicon layer which was not preoxidized and therefore had a smoother surface. The lower effective barrier height indicates a higher tunneling current for a given applied field or enhanced electron conductivity across the oxide layer between the polycrystalline silicon layers. Thus, in the floating gate memory device 10, the portion 26a of the oxide layer 26 between the textured surfaces 28 and 32 of the floating gate 20 and control gate 30 respectively will have a higher tunneling conductivity so that it can be made thicker and still have the same tunneling conductivity as a thinner oxide layer between two smooth surfaces.

Still another result which can be seen from the above Table is that the difference between the plus and minus effective barrier heights for the substrate having the preoxidized polycrystalline silicon layer is much less than the difference between the plus and minus effective barrier heights of the control substrate which has the polycrystalline silicon layer which was not preoxidized. This means that for a given applied voltage, the tunneling currents across the oxide layer in the preoxidized device in both directions are approximately equal. For the floating gate memory device 10, this means that the applied voltage required to charge or discharge (write or erase) the floating gate 20 will be substantially equal.

Thus, there is provided by the present invention a floating gate memory device 10 which has a lower capacitance between the floating gate 20 and the control gate 30, with any variations in the thickness of the floating gate 20 having minimal effect on the overall capacitance between the two gates. This is a result of the thicker oxide layer between the sidewalls 24 of the floating gate 20 and their opposed portions of the control gate 30 than between the outer surface 22 of the floating gate 20 and its opposed portion of the control gate 30. Also, the floating gate memory device 10 can have a thicker oxide, layer 26 between the two gates and still have good conduction therebetween as a result of the textured surfaces of the two gates. In addition, the voltages required to charge and discharge the floating gate 20 are closer as a result of the textured surfaces of the two gates. Furthermore, the combination of the thicker oxide layer between the sidewalls 24 of the floating gate 20 and the opposed portions of the control gate 30 and the greater barrier height between the sidewalls 24 and the opposed portions of the control gate 30 because of the smoother opposed surfaces, eliminates electron flow between the sidewalls 24 and the control gate 30 so that virtually all the electron current is carried across the portion of the oxide layer between the textured surfaces 22 and 32 of the gates 20 and 30. Thus, for a given applied field, the current flow between the gates 20 and 30 should be more reproducible since variations in the thickness of the floating gate 20 will not affect the surface area across which electron injection is occurring.

I claim:

1. In a floating gate memory device which includes a substrate of a semiconductor material, a first layer of an insulating material on a surface of said substrate, a conductive floating gate on said first insulating layer, said floating gate having an outer surface and sidewalls, a second layer of an insulating material covering the outer surfaces and sidewalls of said floating gate, and a conductive control gate on said second insulating layer, said control gate having inner surface portions opposed to the outer surfaces and sidewalls respectively of the floating gate, the improvement comprising;

the outer surface of the floating gate and the opposed portion of the inner surface of the control gate being textured, and the portion of the second insulating layer between the outer surface of the floating gate and its opposed portion of the inner surface of the control gate being thinner than the portions of the second insulating layer between the sidewalls of the floating gate and their opposed portions of the inner surface of the control gate.

2. A floating gate memory device in accordance with claim 1 in which the floating gate and the control gate are each of conductive polycrystalline silicon.

3. A floating gate memory device in accordance with claim 2 in which the second insulating layer is of silicon oxide.

4. A floating gate memory device in accordance with claim 3 in which the sidewalls of the floating gate are relatively smoother than the textured outer surface of the floating gate.

5. A floating gate memory device in accordance with claim 4 in which the textured outer surface of the floating gate has undulations and the textured inner surface of the control gate has undulations which substantially follow the undulations of the textured outer surface of the floating gate.

* * * * *